(12) United States Patent
Yeh et al.

(10) Patent No.: US 12,354,588 B2
(45) Date of Patent: Jul. 8, 2025

(54) ADAPTIVE NOISE CANCELLING SYSTEM FOR AUTOMOTIVE HANDS-FREE TELECOMMUNICATIONS

(71) Applicant: Tesla, Inc., Austin, TX (US)

(72) Inventors: David Yeh, San Jose, CA (US);
Tzu-Sheng Hsu, Sunnyvale, CA (US)

(73) Assignee: Tesla, Inc., Austin, TX (US)

(*) Notice: Subject to any disclaimer, the term of this patent is extended or adjusted under 35 U.S.C. 154(b) by 183 days.

(21) Appl. No.: 18/006,867

(22) PCT Filed: Jul. 27, 2021

(86) PCT No.: PCT/US2021/071004
§ 371 (c)(1),
(2) Date: Jan. 25, 2023

(87) PCT Pub. No.: WO2022/027031
PCT Pub. Date: Feb. 3, 2022

(65) Prior Publication Data
US 2023/0274725 A1    Aug. 31, 2023

Related U.S. Application Data

(60) Provisional application No. 63/057,811, filed on Jul. 28, 2020.

(51) Int. Cl.
*G10K 11/16* (2006.01)
*G10K 11/178* (2006.01)
(Continued)

(52) U.S. Cl.
CPC .. *G10K 11/17883* (2018.01); *G10K 11/17854* (2018.01); *G10K 11/17881* (2018.01); *H03G 5/165* (2013.01)

(58) Field of Classification Search
CPC ....... G10K 11/17883; G10K 11/17881; G10K 11/17854; H03G 5/165
(Continued)

(56) References Cited

U.S. PATENT DOCUMENTS

| 10,580,399 B1* | 3/2020 | Bastyr .............. G10K 11/17825 |
| 2014/0256258 A1* | 9/2014 | DeLuca ................ H04W 4/023 455/41.2 |

(Continued)

FOREIGN PATENT DOCUMENTS

| EP | 1 879 180 | 5/2009 |
| FR | 2906070 | 3/2008 |

OTHER PUBLICATIONS

Essebbar et al., Aug. 27-31, 2007, Speech enhancement using multi-reference noise reduction in a vehicle environment, Interspeech 2007, Antwerp, Belgium, pp. 838-841.
(Continued)

*Primary Examiner* — Ammar T Hamid
(74) *Attorney, Agent, or Firm* — Knobbe, Martens, Olson & Bear, LLP (57) ABSTRACT

An adaptive noise cancelling system utilizing a plurality of multi-axis accelerometers and a plurality of microphones, wherein the plurality of multi-axis accelerometers and the plurality microphones may be used in combination to pick up vibrations on a chassis of a vehicle. The accelerometers may be positioned at point near the suspension knuckles or joints of the vehicle, and the microphones may be positioned near the headrest and sun visor of the vehicle. The adaptive noise cancelling system may use an adaptive algorithm to derive one or more filter weights that model a transfer function between the vibrations on the chassis of the vehicle to an acoustic pressure at the plurality of microphones location.

30 Claims, 9 Drawing Sheets

(51) Int. Cl.
*H03G 5/16* (2006.01)
*H04B 1/00* (2006.01)

(58) Field of Classification Search
USPC .......................................... 381/71.4, 74.1, 86
See application file for complete search history.

(56) References Cited

U.S. PATENT DOCUMENTS

| | | | |
|---|---|---|---|
| 2017/0323631 A1* | 11/2017 | Close | G06F 13/4291 |
| 2019/0028803 A1* | 1/2019 | Benattar | H04S 7/304 |
| 2019/0058242 A1* | 2/2019 | Tabe | H01Q 1/248 |
| 2020/0387224 A1* | 12/2020 | Das | G06F 3/016 |
| 2020/0391670 A1* | 12/2020 | Jain | H04R 3/04 |

OTHER PUBLICATIONS

Takashima et al., Aug. 28, 2017, Separation of vibration-derived sound signals based on fusion processing of vibration sensors and microphones, 2017 25th European Signal Processing Conference (EUSIPCO), pp. 2428-2432.
Vaseghi, Jan. 1, 2000, Spectral subtraction, in Advanced Digital Signal Processing and Noise Reduction, Second Ed., John Wiley & Sons Ltd., pp. 333-354.
International Search Report and Written Opinion dated Jan. 5, 2022 in Application No. PCT/US2021/071004.
Cartes et al., 2003, Lyapunov tuning of the leaky LMS algorithm for single-source, single-point noise cancellation, Mechanical Systems and Signal Processing, 17(5):925-944.

\* cited by examiner

ADAPTIVE NOISE CANCELLING SYSTEM FOR AUTOMOTIVE HANDS-FREE TELECOMMUNICATIONS

CROSS-REFERENCE TO RELATED APPLICATIONS

This application is filed under 35 U.S.C. § 371 as the U.S. National Phase of Application No. PCT/US2021/071004 entitled "ADAPTIVE NOISE CANCELLING SYSTEM FOR AUTOMOTIVE HANDS-FREE TELECOMMUNICATIONS" and filed Jul. 27, 2021, and which claims priority to U.S. Provisional Application No. 63/057,811 filed Jul. 28, 2020, each of which is incorporated by reference in its entirety.

TECHNICAL FIELD

The disclosed subject matter generally relates to systems and methods for adaptive noise cancelling for automotive hands-free telecommunications.

BACKGROUND

Traditional hands free protocol telephony systems (HFP) are required for carrying a phone conversation while driving in an automotive vehicle in many jurisdictions across the globe. Some automotive vehicles may provide a speakerphone system to allow a hands free conversation in a phone call, where the speech may be recorded using microphones. However, the microphones may pick up high levels of vehicular noise. Reducing road noise at highway speeds is a major challenge as the signal processing methods for suppressing the noise also distorts speech. Thus, there exists a need for a system that can subtract road noise from the speech signal of a microphone from a HFP telephony system without distorting speech.

SUMMARY

For purposes of summarizing, certain aspects, advantages, and novel features have been described herein. It is to be understood that not all such advantages may be achieved in accordance with any one particular embodiment. Thus, the disclosed subject matter may be embodied or carried out in a manner that achieves or optimizes one advantage or group of advantages without achieving all advantages as may be taught or suggested herein.

The details of one or more variations of the subject matter described herein are set forth in the accompanying drawings and the description below. Other features and advantages of the subject matter described herein will be apparent from the description and drawings, and from the claims. The disclosed subject matter is not, however, limited to any particular embodiment disclosed.

One embodiment is an adaptive noise cancelling system for a vehicle. This embodiment may include: a plurality of multi-axis accelerometers mounted to the vehicle; a plurality of microphones located in the cabin of the vehicle; and a telephony noise canceller configured to receive signals from the plurality of multi-axis accelerometers and plurality of microphones, wherein the plurality of microphones also provide a speech signal of a user of the vehicle to the telephony noise canceller, wherein the telephony noise canceller is configured to remove correlated road noise via linear subtraction.

Another embodiment is an adaptive noise cancelling system that includes: a plurality of multi-axis accelerometers; a plurality of microphones, wherein the plurality of multi-axis accelerometers and the plurality microphones in combination pick up vibrations on a chassis of a vehicle for canceling background noise, wherein the plurality of microphones is an array of microphones processed via a beamformer to generate a virtual microphone signal with road noise of the vehicle; and a telephony noise canceller receiving the virtual microphone signal and signals from the plurality of multi-axis accelerometers to remove correlated road noise via linear subtraction.

Yet another embodiment is a method for cancelling noise in a vehicle. This method includes: reading accelerometer data from a plurality of multi-axis accelerometers mounted to the vehicle; obtaining voice data from a plurality of microphones located in the cabin of the vehicle; and inputting the accelerometer data and voice data a telephony noise canceller to remove correlated road noise via linear subtraction.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations as provided below.

FIGS. 2Aa and 2Ab show setups displaying example locations of microphones, according to some embodiments of the present disclosure.

FIGS. 2Ba to 2Bd further illustrate setups displaying example locations of accelerometers within a vehicle, according to some embodiments of the present disclosure.

The figures may not be to scale in absolute or comparative terms and are intended to be exemplary. The relative placement of features and elements may have been modified for the purpose of illustrative clarity. Where practical, the same or similar reference numbers denote the same or similar or equivalent structures, features, aspects, or elements, in accordance with one or more embodiments.

DETAILED DESCRIPTION

In the following, numerous specific details are set forth to provide a thorough description of various embodiments. Certain embodiments may be practiced without these specific details or with some variations in detail. In some instances, certain features are described in less detail so as not to obscure other aspects. The level of detail associated with each of the elements or features should not be construed to qualify the novelty or importance of one feature over the others.

Overview

Hands free protocol telephony systems (HFP) are required for carrying a phone conversation while driving in many jurisdictions across the globe. Automotive vehicles may provide a speakerphone system to allow hands free conversation during a phone call. The speech may be input into the hands free system using microphones located within the cabin of the vehicle. However, the microphones may pick up high levels of vehicular noise. A primary source of noise is from the wind and road, particularly as a vehicle travels at high speeds. Reducing road noise at highway speeds is a major challenge as the signal processing methods for suppressing the noise also tend to distort speech.

Embodiments of the invention relate to a system which incorporates one or more accelerometers attached to positions on the vehicle. The accelerometers may act as coherent noise references by measuring vibrations occurring on different portions of the vehicle and using those measured vibrations as an input into the nose cancellation system for subtracting road noise from the speech signal. Unlike using cabin noise as an input, it was discovered that using accelerometers or other vehicle-based sensors as input to a noise cancellation system did not result in distorted speech as the output. Some applications of the disclosed technology for cancelling noise may include: 1. Telephony (e.g., hands free phone calls and improved statistics for beamforming and noise suppression), 2. Voice chat and/or videoconferencing, 3. Voice chat during gaming, 4. In car communication (front seat to rear seat), 5. Karaoke, and 6. Voice commands and/or voice assistant.

Alternative embodiments of the disclosed technology may include adding microphones near tire locations (e.g., suspension knuckle) in addition to accelerometers to increase the frequency range of the noise that is measured, and then cancelled. An additional alternative embodiment may include positioning the accelerometers to locations on the vehicle that are not zoned around the suspension and/or tire systems of the vehicle. For example, the accelerometers my be placed on the undercarriage, body, doors, windows, sills, bumpers, or other areas of a vehicle to measure road noise and provide an input into the noise cancellation system. Further an additional alternative embodiment includes replacing the accelerometers with a set of microphones spread at or near the floor panel of the vehicle.

Exemplary System

Figure 1:
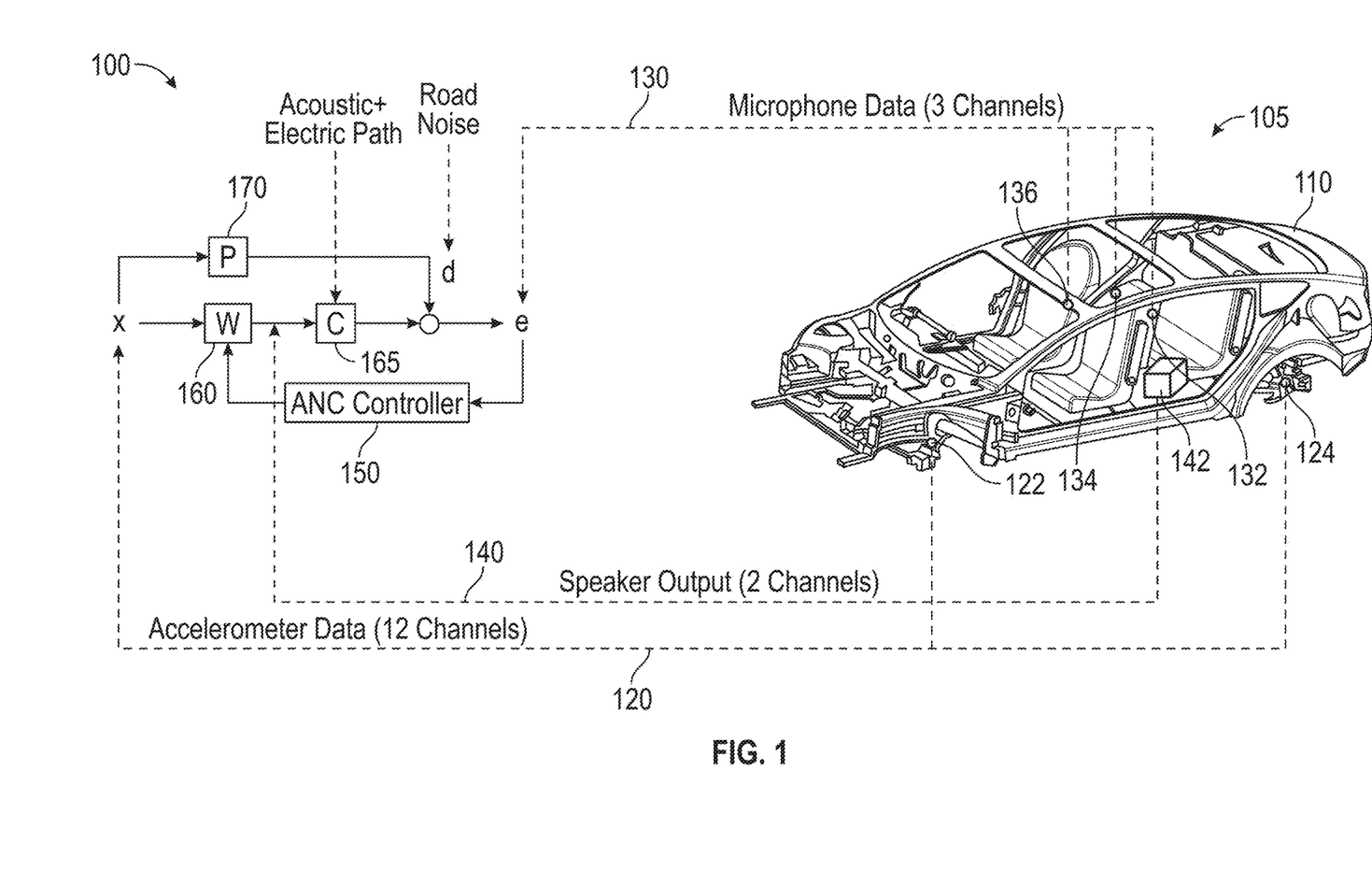
FIG. 1 is a diagram illustrating an adaptive noise cancelling system, according to some embodiments of the present disclosure.
Figure 2:
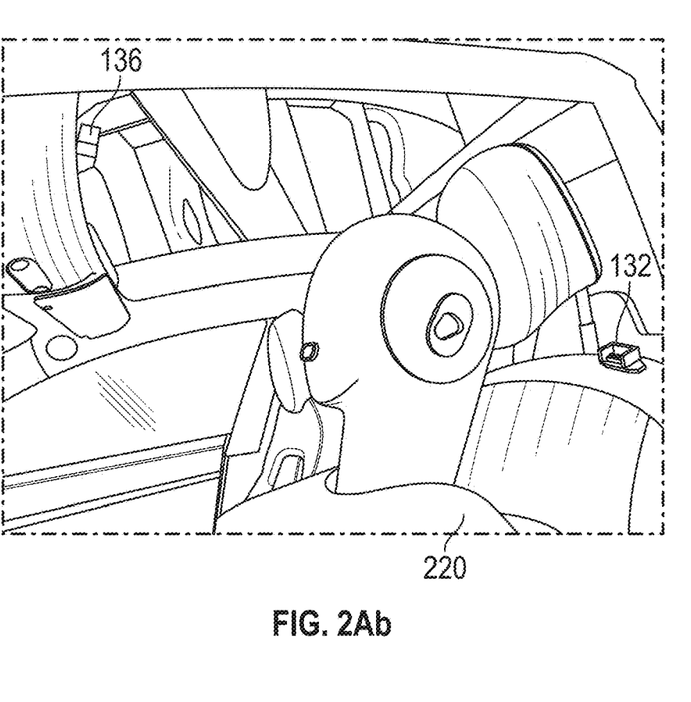

FIGS. 1-2B of the present disclosure show embodiments of the adaptive noise cancelling system 100 for automotive hands-free telecommunications. FIG. 1 is a diagram illustrating the adaptive noise cancelling system 100. The adaptive noise cancelling system is configured to pick up vibrations on a chassis 110 of a vehicle 105 via a combination of accelerometers and microphones that output audio rate accelerometer data 120. The accelerometers are placed at points on the chassis of the vehicle with high coherence to structure-borne noise, where the noise may also be sensed at the telephony microphone location.

As shown in FIG. 1, microphone data 130 is sent and received from microphones 132 and 134 which are positioned and/or near the left and right sides of a headrest of the driver in the vehicle. An additional microphone 136 is positioned and/or near the sun visor of the driver, respectively.

In some embodiments, additional microphones may be also positioned and/or near the left and right sides of headrests of any of the passenger seats in the vehicle or positioned and/or near the sun visor of the vehicle passengers. In some embodiments, the microphone data (e.g., audio data) that is passed throughout the adaptive noise cancelling system is three channels (e.g., one channel per microphone, where the microphones include a visor microphone, left side headrest microphone, and right side headrest microphone). Additionally accelerometer data 120 may be sent and received from multi-axis accelerometers positioned and/or near the suspension knuckles 122 and 124 and/or suspension joints of the vehicle. In some embodiments, the accelerometer data 120 that is passed throughout the adaptive noise cancelling system is twelve channels (e.g., four, three-axis accelerometers, each placed at and/or near the four suspension knuckles at each wheel of the vehicle, where one axis is one channel). The system may also include a speaker 142 for outputting cancellation of the road noise based on the audio rate accelerometer data via the accelerometers and microphones. In some embodiments, the speaker output (e.g., audio output data) of the adaptive noise cancelling system is two channels (e.g., a left channel and right channel).

In certain embodiments, the accelerometer data 120 is operated upon by an active noise control (ANC) controller 150 that utilizes filter weights (W) 160 derived by an algorithm that models a transfer function (P) 170 between the vibrations on the chassis of the vehicle to the acoustic pressure at the microphone locations. The filter weights W may be used to predict the road noise signal (d) that is compared against the acoustic plus electric path (C) 165. The result is an error signal (e) that is fed back into the ANC controller 150.

FIGS. 2Aa and 2Ab show the setup 200 for example locations of microphones within a vehicle. In FIG. 2Aa a microphone 132 is positioned to the left of the driver headrest 210, a microphone 134 is positioned to the right of the driver headrest. In FIG. 2Ab, a microphone 136 is positioned at the end of a sun visor for a driver 220.

FIGS. 2Ba-d, further illustrate a setup 250 where accelerometers may be position at various locations within a vehicle. In FIGS. 2Ba a multi-axis accelerometer 260 is positioned on the suspension of a vehicle. In FIGS. 2Bb a multi-axis accelerometer 270 is positioned at a first suspension knuckle. In FIGS. 2Bc a multi-axis accelerometer 280 is positioned on another suspension link within a vehicle. In FIG. 2Bd a multi-axis accelerometer 290 is positioned on a suspension link of a vehicle. Thus, four accelerometers are used, with one accelerometer being positioned at each suspension knuckle, totaling four multi-axis accelerometers for the four suspension knuckles of the vehicle. In certain embodiments, three axis accelerometers are utilized, but other accelerometers can be used in other embodiments.

Exemplary System Flowcharts

Figure 3:
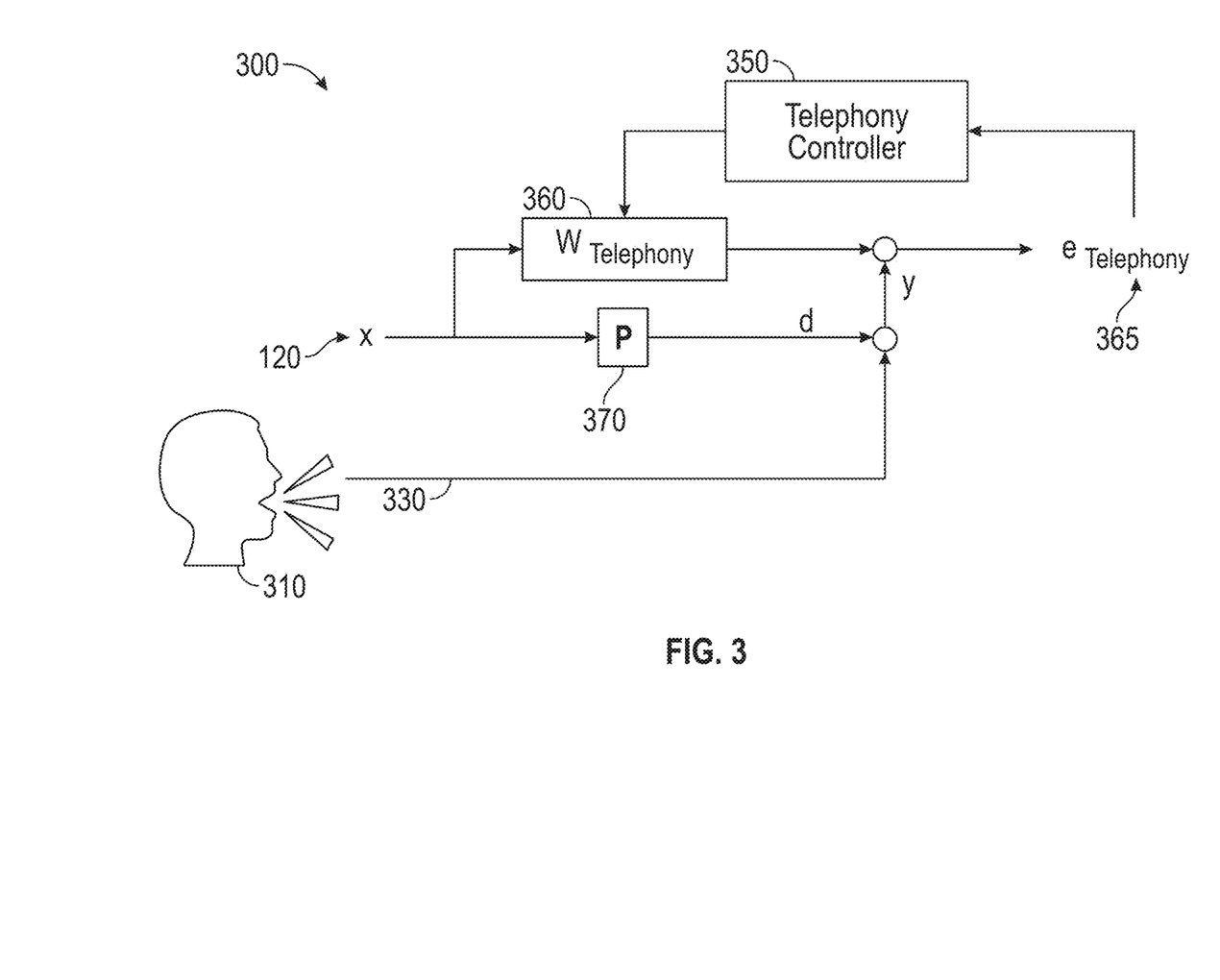
FIG. 3 is a block diagram illustrating the adaptive noise cancelling process for automotive hands-free telecommunications, according to some embodiments of the present disclosure.
Figure 4A:
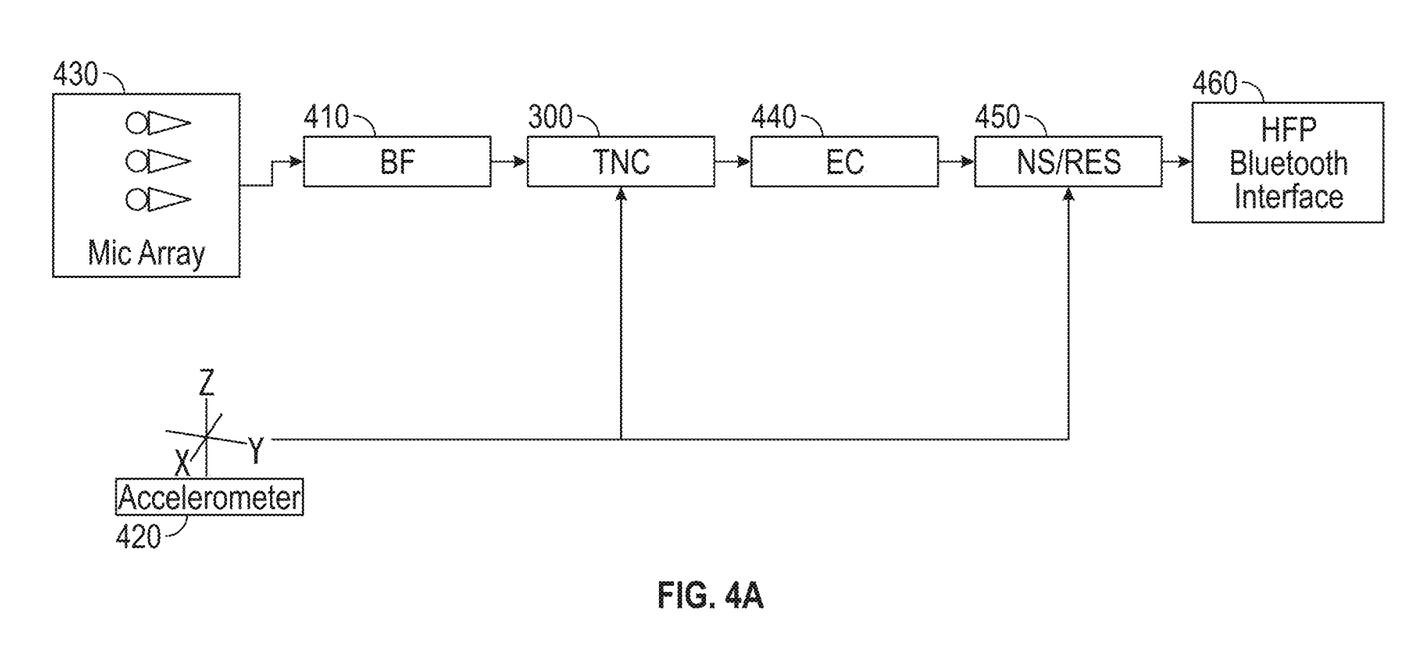
FIG. 4A, is a block diagram illustrating the usage of accelerometer inputs for adaptive noise cancelling within a telephony voice processing system, according to some embodiments of the present disclosure.
Figure 4B:
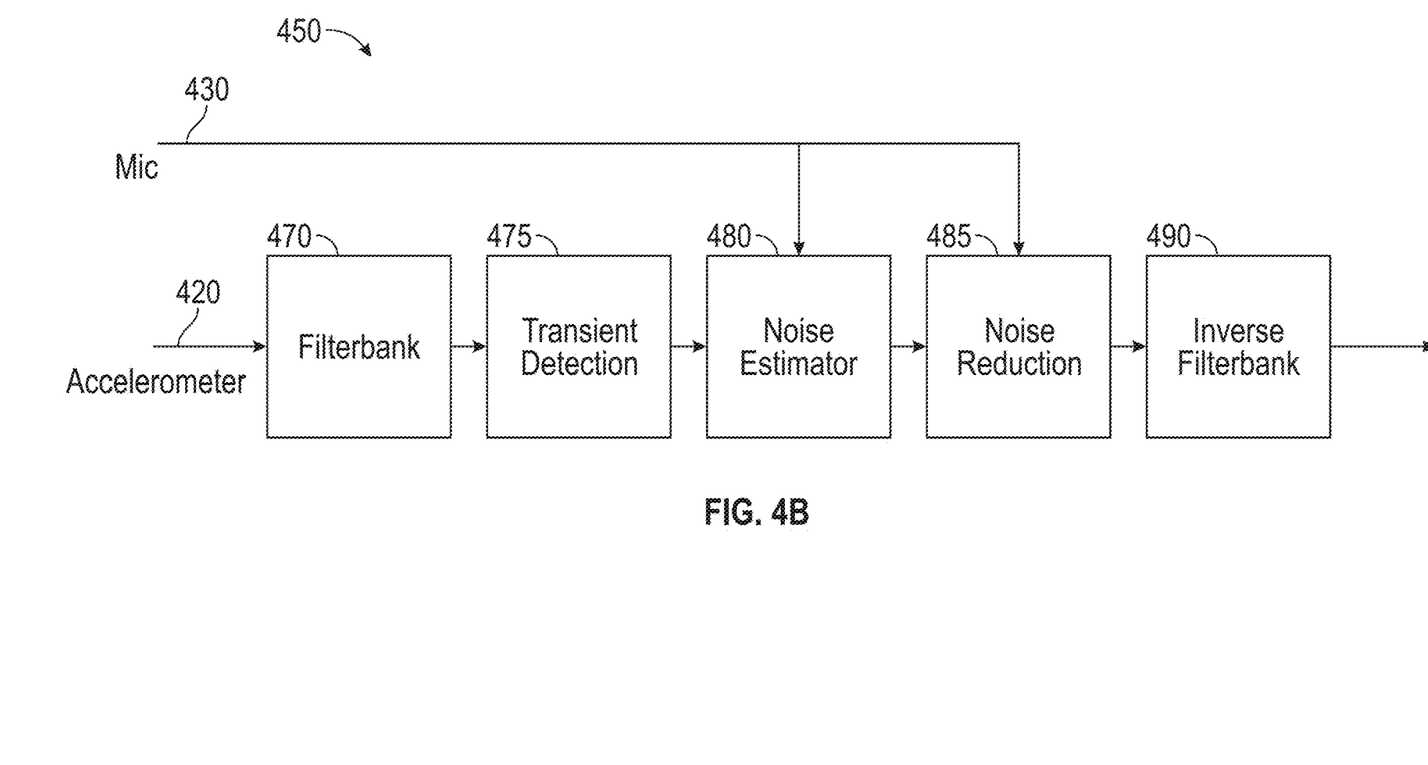
FIG. 4B is a block diagram of an embodiment of a component of the adaptive noise cancelling system illustrated in FIG. 4A.

FIGS. 3-4 of the present disclosure illustrate diagrams of the adaptive noise cancelling system for automotive hands-free telecommunications, according to some embodiments.

FIG. 3 is a block diagram illustrating a telephony noise canceller (TNC) component 300 that may be part of the adaptive noise cancelling system 100 for automotive hands-free telecommunications. In this system, an adaptive algorithm, such as least mean squares filter (LMS), derives filter weights (W_telephony) 360 that model a transfer function (P) 370 between the vibrations on the chassis of the vehicle (x) 120 and the acoustic pressure at the microphone location (y). W is used to predict the road noise signal (d) and subtract it from the microphone signal 330 based on speech that is output by a user 310. A resulting error signal ($e_{telephony}$) 365 is fed to a telephony controller 350 that may adjust the filter weights (W_telephony) 360. Adaptation can be done either in the time domain using Normalized Leaky LMS with momentum to aid convergence, or in the frequency domain using an adaptive frequency domain filter such as a multi delay filter.

In some embodiments, other adaptive algorithms may be used to estimate the transfer function. In some embodiments, a recursive least squares filter (RLS) or Kalman filter may also be used. In some embodiments, the disclosed technology can be run in parallel, or be integrated into or used in conjunction with an active noise cancellation system such as illustrated in FIG. 1.

FIG. 4A, is a flow diagram showing the incorporation of adaptive telephony noise cancelation in a telephony voice processing system 400, according to some embodiments. The audio sample rate accelerometers 420 (e.g., the accelerometers detailed in the exemplary system) are connected to the audio system on a same sample clock as the telephony microphones (e.g., the microphones detailed in the exemplary system). In some embodiments, this may be achieved using audio rate accelerometers connected to the same automotive audio bus (A2B) as digital microphones.

An array of microphones 430 (e.g., the microphones detailed in the exemplary system) can be processed with a beamformer (BF) 410 to generate a virtual microphone signal with the road noise.

Beamforming may be utilized on a single microphone. If a microphone array 430 or a plurality of microphones are used, any one of a number of established microphone beamforming methods can be used to derive a linear signal upon which to perform adaptive noise cancelation. If the beamformer 410 is nonlinear or adaptive, it may be advantageous to place the adaptive noise cancellation on the individual microphone signals prior to beamforming. Any one of the well-established microphone beamforming methods can be used depending on the array design: broadside beamforming, differential beamforming, Linearly Constrained Minimum Variance (LCMV), Minimum Variance Distortionless Response (MVDR), General Sidelobe Canceller (GSC) or Parametric Multichannel Wiener Filter (PMWF), or any of their derivatives. If the beamformer 410 is linear time-invariant, it can potentially be placed before the adaptive noise cancelling block to reduce the number of channels that need to be processed.

The Telephony Noise Canceller (TNC) 300 then uses the virtual microphone signal from beamformer 410 and the accelerometers 420 to remove correlated road noise via linear subtraction. The signal is then processed with an adaptive echo canceller 440. Residual noise and echo are estimated and removed by a noise suppressor and/or residual echo suppressor 450. The processed audio signal is then equalized, range limited, and sent via the Bluetooth interface 460 to a connected phone using the Hands-Free Profile as specified by the Bluetooth standards. In certain embodiments, another interface may be utilized which may include a different profile.

The noise suppressor 450 may optionally include input from the accelerometers 420. In addition to or in lieu of using the accelerometers 420 to cancel the noise in the telephony microphones using an adaptive filter, the information from the accelerometers can also be used to improve the performance of the noise suppression (NS) block 450.

Noise suppressor is a common building block in hands free telephony processing systems, and typically operates in the spectral domain by estimating the noise spectrum and removing it from the microphone signal. The noise removal can be done via a number of well-known methods in the literature, i.e., spectral subtraction (Martin 1994), or modifications of Wiener filtering (Ephraim, Malah 1984). A single channel NS is well-known to suppress statistically stationary noise, and has difficulty suppressing transient noises like door slams, or road impacts. The noise accelerometers can be used to estimate the noise spectrum due to road noise more accurately, and consequently improve the performance of the noise suppressor.

This can be done in a number of ways, including the following:
1) The noise estimate output of the adaptive filter can be used as a road noise reference in the noise suppressor in the same way post filtering (Cohen 2004) is done for beamformers. This may suppress both stationary and transient road noise.
2) Estimate the transfer function between the accelerometers and microphones using a spectral approach such as tfestimate in matlab, and use that to generate the road noise estimate. This may also suppress both stationary and transient road noise.
3) Various heuristics are also possible in the spectral domain e.g., by repurposing the power spectral density estimator of voice and of noise to detect transients in road noise (Martin 1994), and use the spectra of those transients to modify the speech presence probability (decrease the speech presence probability in noise bands to mark them as noise to be removed). The speech presence probability can then be used in the usual way to generate the noise estimate with the transients included (Cohen 2002). Similarly, a voice activity detector could be used as a simplified form of speech presence probability.

FIG. 4B is a diagram of an embodiment of the noise suppressor 450 of the adaptive noise cancelling system 400 illustrated in FIG. 4A. Following one of the techniques described above, data from the accelerometers 420 is received by a filter bank 470. After filtering is performed at filter bank 470, the result is sent for transient detection 475. The results are then provided to a noise estimator 480 that also receives input from the microphones 430. After the noise is estimated, the results are provided to a noise reducer 485 that also receives input from the microphones 430. After the noise reduction is performed, the output of the noise reducer 485 is sent to an inverse filter bank 490 for final processing.

Exemplary System Data

FIGS. 5A-7 of the present disclosure show exemplary system data of the adaptive noise cancelling system via various charts and graphs, according to some embodiments.

Figure 5A:
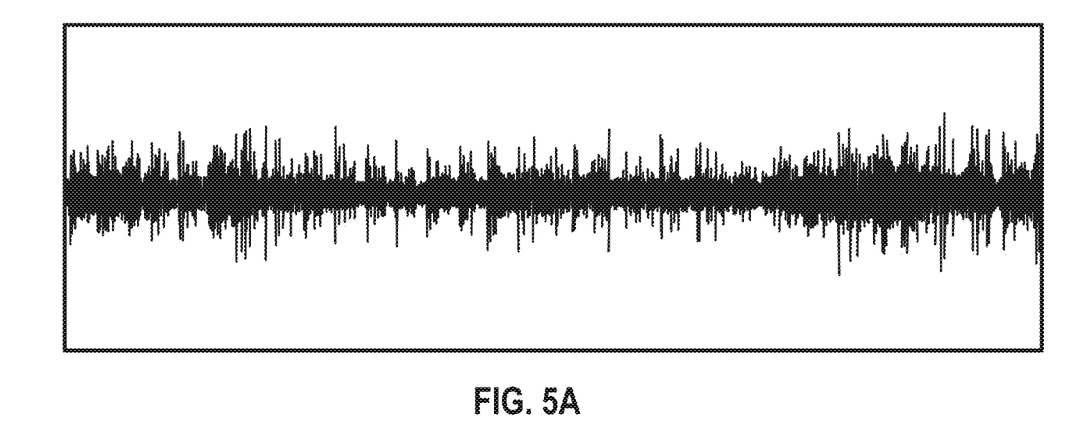
FIG. 5A is a chart displaying sample road noise data without a adaptive noise cancelling system.
Figure 5B:
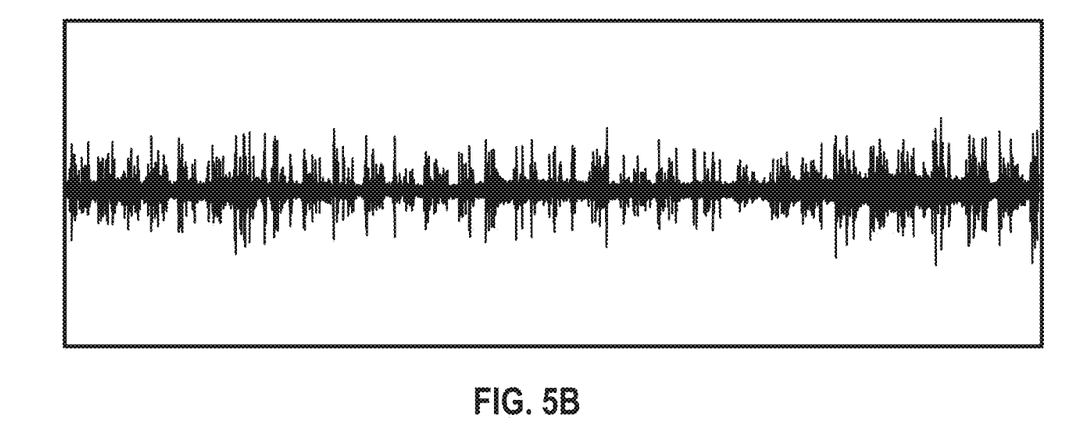
FIG. 5B is a chart displaying sample road noise data with the adaptive noise cancelling system of the present application in place.

FIG. 5A, is a chart displaying sample road noise data that has not been processed through the adaptive noise cancelling system. FIG. 5B, is a graph displaying the sample road noise data after processing through with the adaptive noise cancelling system. As shown in FIG. 5A, the amount of road noise is reduced following processing by the noise cancelling system.

Figure 6:
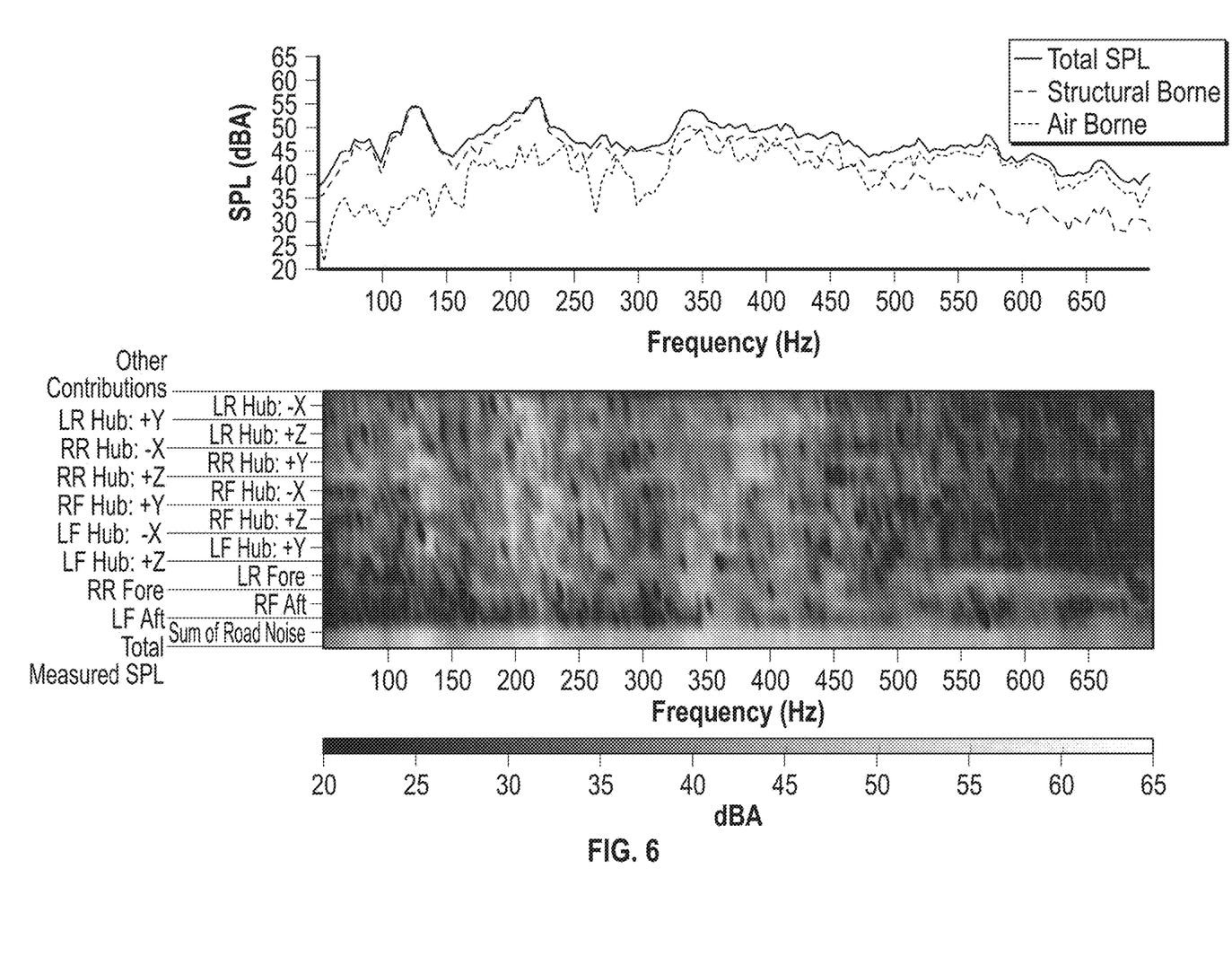
FIG. 6 is a graph displaying sample accelerometer placement data for an embodiment of the adaptive noise cancelling system.

FIG. 6 is a two-portion graph displaying sample accelerometer placement data for the adaptive noise cancelling system. The accelerometer placement may be determined by analyzing the contribution of each accelerometer channel (as seen on the Y axis of bottom graph) to the microphone signal as seen in FIG. 6. The optimal transfer functions between accelerometer channels to microphone channels is estimated in the frequency domain. This transfer function is multiplied with the accelerometer signal under consideration to get its contribution. In some embodiments, the multi-axis accelerometers are placed on suspension knuckles and/or on the body of the car near the suspension joints for best correlation to noise at the microphone locations. In some embodiments, multiple accelerometers may be used to sense all structure borne noise sources audible at the microphone location.

Figure 7A:
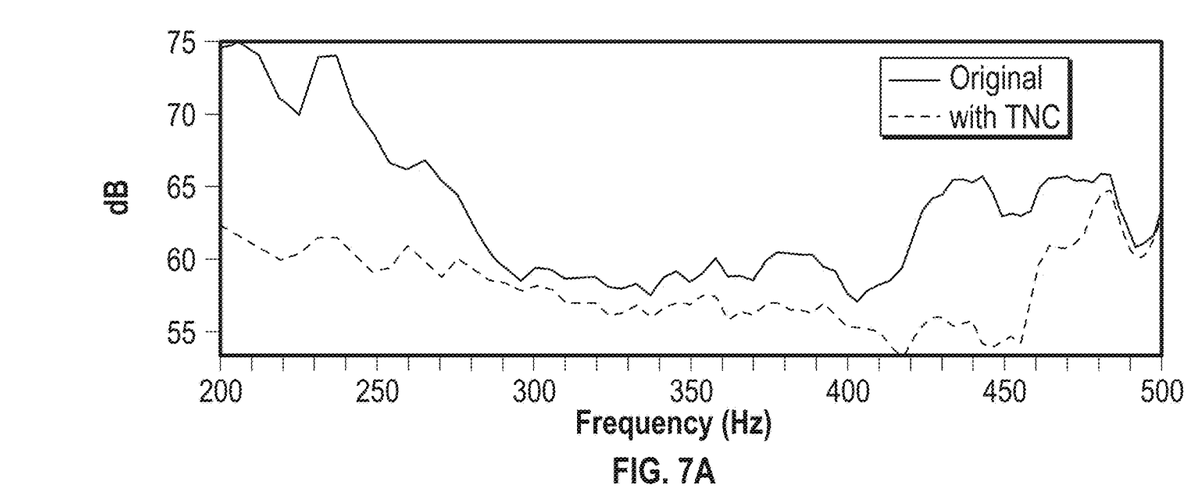
FIG. 7A is a line graph displaying a comparison of spectrums with and without an adaptive noise cancelling system.
Figure 7B:
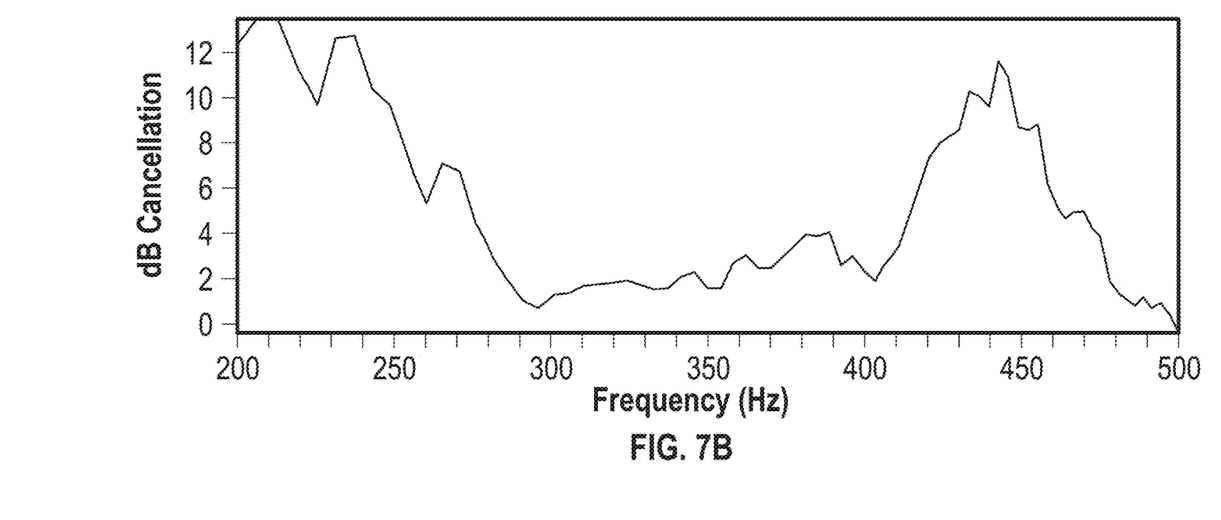
FIG. 7B is a line graph showing the amount of cancellation with the adaptive noise cancellation system that would occur from the example of FIG. 7A.

FIGS. 7A-B are graphs displaying sample noise reduction data with the adaptive noise cancelling system. The graph of FIG. 7A shows example noise reduction possible during a segment of speech while driving on the freeway at 65 mph. Overall noise is reduced by up to about 13 dB in a voice band between 200 Hz and 500 Hz. FIG. 7B is a plot of noise cancellation in dB for the same frequency range of between 200 and 500 Hz. Spectral peaks caused by road noise are reduced between about 6-12 dB. The speech component at 300 Hz is substantially untouched.

Example Implementations

Many variations and modifications may be made to the above-described embodiments, the elements of which are to be understood as being among other acceptable examples. All such modifications and variations are intended to be included herein within the scope of this disclosure. The foregoing description details certain embodiments. It will be appreciated, however, that no matter how detailed the foregoing appears in text, the systems and methods can be practiced in many ways. As is also stated above, it should be noted that the use of particular terminology when describing certain features or aspects of the systems and methods should not be taken to imply that the terminology is being re-defined herein to be restricted to including any specific characteristics of the features or aspects of the systems and methods with which that terminology is associated.

The systems, methods, and devices described herein each have several aspects, no single one of which is solely responsible for its desirable attributes. Without limiting the scope of this disclosure, several non-limiting features will now be discussed briefly. The following paragraphs describe various example implementations of the devices, systems, and methods described herein. A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

Example One

An adaptive noise cancelling system comprising a plurality of multi-axis accelerometers and a plurality of microphones, wherein the plurality of multi-axis accelerometers and the plurality microphones are used in combination to pick up vibrations on a chassis of a vehicle.

Example Two

The adaptive noise cancelling system of Example One, wherein a first microphone of the plurality of microphones is positioned right of a headrest in the vehicle.

Example Three

The adaptive noise cancelling system of Example One, wherein a second microphone of the plurality of microphones is positioned left of a headrest in the vehicle.

Example Four

The adaptive noise cancelling system of Example One, wherein a third microphone of the plurality of microphones is positioned on a sun visor in the vehicle.

Example Five

The adaptive noise cancelling system of Example One, wherein the plurality of multi-axis accelerometers output accelerometer data that is twelve channels.

Example Six

The adaptive noise cancelling system of Example One, wherein at least one accelerometer of the plurality of accelerometers is positioned on a suspension knuckle of the vehicle.

Example Seven

The adaptive noise cancelling system of Example One, wherein at least one accelerometer of the plurality of accelerometers is positioned on a suspension joint of the vehicle.

Example Eight

The adaptive noise cancelling system of Example One, wherein the plurality of accelerometers output accelerometer data that is in three channels.

Example Nine

The adaptive noise cancelling system of Example One, wherein the adaptive noise cancelling system further comprises a speaker system.

Example Ten

The adaptive noise cancelling system of Example Nine, wherein the speaker system outputs audio data that is two channels.

Example Eleven

The adaptive noise cancelling system of Example One, wherein the adaptive noise cancelling system using an adaptive algorithm.

Example Twelve

The adaptive noise cancelling system of Example Eleven, wherein the adaptive algorithm derives one or more filter weights that model a transfer function between the vibrations on the chassis of the vehicle to an acoustic pressure at the plurality of microphones location.

Example Thirteen

The adaptive noise cancelling system of ExampleEleven, wherein the adaptive algorithm is a least mean squares filter.

Example Fourteen

The adaptive noise cancelling system of ExampleEleven, wherein the adaptive algorithm is a recursive least squares filter.

Example Fifteen

The adaptive noise cancelling system of ExampleEleven, wherein the adaptive algorithm is a Kalman filter.

Example Sixteen

The adaptive noise cancelling system of Example One, wherein the plurality of multi-axis accelerometers use a sample clock that is the same as for the plurality of microphones.

Example Seventeen

The adaptive noise cancelling system of Example One, wherein the plurality of multi-axis accelerometers use an automotive audio bus (A2B) that is the same as for the plurality of microphones.

Example Eighteen

The adaptive noise cancelling system of Example One, wherein the plurality of microphones are an array of microphones.

Example Nineteen

The adaptive noise cancelling system of Example Eighteen, wherein the array of microphones is processed via a beamformer to generate a virtual microphone signal with road noise of the vehicle.

Example Twenty

The adaptive noise cancelling system of Example Nineteen, wherein the virtual microphone signal is used by a telephony noise canceller and the plurality of multi-axis accelerometers to remove correlated road noise via linear subtraction.

Example Twenty-one

The adaptive noise cancelling system of Example One, wherein the plurality of microphones is processed via a beamformer to generate a virtual microphone signal with road noise of the vehicle.

Example Twenty-two

The adaptive noise cancelling system of Example Nineteen, wherein the virtual microphone signal and the plurality of multi-axis accelerometers are processed by a telephony noise canceller to remove correlated road noise via linear subtraction.

Example Twenty-three

The adaptive noise cancelling system of Example One, additionally comprising a telephony noise canceller receiving signals from the plurality of multi-axis accelerometers, wherein the plurality of microphones provide a speech signal of a user of the vehicle to the telephony noise canceller to remove correlated road noise via linear subtraction.

Example Twenty-four

The adaptive noise cancelling system of Example Twenty-three, additionally comprising an adaptive echo canceller receiving the output of the telephony noise canceller and is configured to cancel echo from the received signal.

Example Twenty-five

The adaptive noise cancelling system of Example Twenty-four, additionally comprising a noise suppressor that receives the output of the adaptive echo canceller and is configured to estimate a noise spectrum of the received signal and suppress road noise.

Example Twenty-six

The adaptive noise cancelling system of Example Twenty-five, additionally comprising a hands-free profile interface that receives the output of the noise suppressor and is configured to equalize and range limit the received signal and send the resultant signal to a connected phone.

Example Twenty-seven

The adaptive noise cancelling system of Example Twenty-six, wherein the hands-free profile interface is a hands-free profile Bluetooth interface.

Example Twenty-eight

The adaptive noise cancelling system of Example Twenty-three, additionally comprising a hands-free profile interface that receives the output of the telephony noise canceller and is configured to equalize and range limit the received signal and send the resultant signal to a connected phone.

Example Twenty-nine

The adaptive noise cancelling system of Example Twenty-eight, wherein the hands-free profile interface is a hands-free profile Bluetooth interface.

As noted above, implementations of the described examples provided above may include hardware, a method or process, and/or computer software on a computer-accessible medium.

Additional Implementation Considerations

When a feature or element is herein referred to as being "on" another feature or element, it may be directly on the other feature or element or intervening features and/or elements may also be present. In contrast, when a feature or element is referred to as being "directly on" another feature or element, there may be no intervening features or elements present. It will also be understood that, when a feature or element is referred to as being "connected", "attached" or "coupled" to another feature or element, it may be directly connected, attached or coupled to the other feature or element or intervening features or elements may be present. In contrast, when a feature or element is referred to as being "directly connected", "directly attached" or "directly coupled" to another feature or element, there may be no intervening features or elements present.

Although described or shown with respect to one embodiment, the features and elements so described or shown may apply to other embodiments. It will also be appreciated by those of skill in the art that references to a structure or feature that is disposed "adjacent" another feature may have portions that overlap or underlie the adjacent feature.

Terminology used herein is for the purpose of describing particular embodiments and implementations only and is not intended to be limiting. For example, as used herein, the singular forms "a", "an" and "the" may be intended to include the plural forms as well, unless the context clearly indicates otherwise. It will be further understood that the terms "comprises" and/or "comprising," when used in this specification, specify the presence of stated features, steps, operations, processes, functions, elements, and/or components, but do not preclude the presence or addition of one or more other features, steps, operations, processes, functions, elements, components, and/or groups thereof. As used herein, the term "and/or" includes any and all combinations of one or more of the associated listed items and may be abbreviated as "/".

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

Spatially relative terms, such as "forward", "rearward", "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features due to the inverted state. Thus, the term "under" may encompass both an orientation of over and under, depending on the point of reference or orientation. The device may be otherwise oriented (rotated 90 degrees or at other orientations) and the spatially relative descriptors used herein interpreted accordingly. Similarly, the terms "upwardly", "downwardly", "vertical", "horizontal" and the like may be used herein for the purpose of explanation only unless specifically indicated otherwise.

Although the terms "first" and "second" may be used herein to describe various features/elements (including steps or processes), these features/elements should not be limited by these terms as an indication of the order of the features/elements or whether one is primary or more important than the other, unless the context indicates otherwise. These terms may be used to distinguish one feature/element from another feature/element. Thus, a first feature/element discussed could be termed a second feature/element, and similarly, a second feature/element discussed below could be termed a first feature/element without departing from the teachings provided herein.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical values given herein should also be understood to include about or approximately that value, unless the context indicates otherwise.

For example, if the value "10" is disclosed, then "about 10" is also disclosed. Any numerical range recited herein is intended to include all sub-ranges subsumed therein. It is also understood that when a value is disclosed that "less than or equal to" the value, "greater than or equal to the value" and possible ranges between values are also disclosed, as appropriately understood by the skilled artisan. For example, if the value "X" is disclosed the "less than or equal to X" as well as "greater than or equal to X" (e.g., where X is a numerical value) is also disclosed. It is also understood that the throughout the application, data is provided in a number of different formats, and that this data, may represent endpoints or starting points, and ranges for any combination of the data points. For example, if a particular data point "10" and a particular data point "15" may be disclosed, it is understood that greater than, greater than or equal to, less than, less than or equal to, and equal to 10 and 15 may be considered disclosed as well as between 10 and 15. It is also understood that each unit between two particular units may be also disclosed. For example, if 10 and 15 may be disclosed, then 11, 12, 13, and 14 may be also disclosed.

Although various illustrative embodiments have been disclosed, any of a number of changes may be made to various embodiments without departing from the teachings herein. For example, the order in which various described method steps are performed may be changed or reconfigured in different or alternative embodiments, and in other embodiments one or more method steps may be skipped altogether. Optional or desirable features of various device and system embodiments may be included in some embodiments and not in others. Therefore, the foregoing description is provided primarily for the purpose of example and should not be interpreted to limit the scope of the claims and specific embodiments or particular details or features disclosed.

The examples and illustrations included herein show, by way of illustration and not of limitation, specific embodiments in which the disclosed subject matter may be practiced. As mentioned, other embodiments may be utilized and derived therefrom, such that structural and logical substitutions and changes may be made without departing from the scope of this disclosure. Such embodiments of the disclosed subject matter may be referred to herein individually or collectively by the term "invention" merely for convenience and without intending to voluntarily limit the scope of this application to any single invention or inventive concept, if more than one is, in fact, disclosed. Thus, although specific embodiments have been illustrated and described herein, any arrangement calculated to achieve an intended, practical or disclosed purpose, whether explicitly stated or implied, may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The disclosed subject matter has been provided here with reference to one or more features or embodiments. Those skilled in the art will recognize and appreciate that, despite of the detailed nature of the example embodiments provided here, changes and modifications may be applied to said embodiments without limiting or departing from the generally intended scope. These and various other adaptations and combinations of the embodiments provided here are within the scope of the disclosed subject matter as defined by the disclosed elements and features and their full set of equivalents.

What is claimed is:

1. An adaptive noise cancelling system for a vehicle, comprising:
    a plurality of multi-axis accelerometers mounted to the vehicle;
    a plurality of microphones located in the cabin of the vehicle; and
    a telephony noise canceller configured to receive signals from the plurality of multi-axis accelerometers and plurality of microphones, wherein the plurality of microphones also provide a speech signal of a user of the vehicle to the telephony noise canceller, wherein the telephony noise canceller is configured to remove correlated road noise via linear subtraction;
    wherein the telephony noise canceller is configured to:
        use an adaptive algorithm, which derives one or more filter weights that model a transfer function between vibrations on a chassis of the vehicle measured by the plurality of multi-axis accelerometers and an acoustic pressure signal, wherein the acoustic pressure signal is one of the received microphone signals or a virtual microphone signal received from a beamformer;
        predict the correlated road noise signal based on the one or more filter weights and the signals received from the plurality of multi-axis accelerometers; and
        subtract the predicted correlated road noise signal from the acoustic pressure signal;
        wherein the adaptive algorithm is a normalized leaky least mean squares algorithm.

2. The adaptive noise cancelling system of claim 1, additionally comprising a hands-free profile interface that receives the output of the telephony noise canceller and is configured to equalize and range limit the received signal and send the resultant signal to a connected phone.

3. The adaptive noise cancelling system of claim 2, wherein the hands-free profile interface is a hands-free profile Bluetooth interface.

4. The adaptive noise cancelling system of claim 1, wherein a first microphone of the plurality of microphones is positioned right of a headrest in the vehicle.

5. The adaptive noise cancelling system of claim 1, wherein a second microphone of the plurality of microphones is positioned left of a headrest in the vehicle.

6. The adaptive noise cancelling system of claim 1, wherein a third microphone of the plurality of microphones is positioned on a sun visor in the vehicle.

7. The adaptive noise cancelling system of claim 1, wherein the plurality of multi-axis accelerometers output accelerometer data that is twelve channels.

8. The adaptive noise cancelling system of claim 1, wherein at least one accelerometer of the plurality of accelerometers is positioned on a suspension knuckle of the vehicle.

9. The adaptive noise cancelling system of claim 1, wherein at least one accelerometer of the plurality of accelerometers is positioned on a suspension joint of the vehicle.

10. The adaptive noise cancelling system of claim 1, wherein each of the plurality of accelerometers output accelerometer data in three channels.

11. The adaptive noise cancelling system of claim 1, wherein the adaptive noise cancelling system further comprises a speaker system.

12. The adaptive noise cancelling system of claim 11, wherein the speaker system outputs audio data that is two channels.

13. The adaptive noise cancelling system of claim 1, wherein the plurality of multi-axis accelerometers use a sample clock that is the same clock as used by the plurality of microphones.

14. The adaptive noise cancelling system of claim 1, wherein the plurality of multi-axis accelerometers use an automotive audio bus (A2B) that is the same audio bus as used by the plurality of microphones.

15. The adaptive noise cancelling system of claim 1, wherein the plurality of microphones is an array of microphones.

16. The adaptive noise cancelling system of claim 13, wherein the array of microphones is processed via a beamformer to generate a virtual microphone signal with road noise of the vehicle.

17. The adaptive noise cancelling system of claim 14, wherein the virtual microphone signal is used by a telephony noise canceller and the plurality of multi-axis accelerometers to remove correlated road noise via linear subtraction.

18. The adaptive noise cancelling system of claim 1, additionally comprising an adaptive echo canceller receiving the output of the telephony noise canceller and configured to cancel echo from the received signal.

19. The adaptive noise cancelling system of claim 18, additionally comprising a noise suppressor configured to estimate a noise spectrum of the received signal based on the signals received from the plurality of accelerometers and suppress residual road noise using spectral subtraction.

20. The adaptive noise cancelling system of 19, additionally comprising a hands-free profile interface that receives the output of the noise suppressor and is configured to equalize and range limit the received signal and send the resultant signal to a connected phone.

21. The adaptive noise cancelling system of 20, wherein the hands-free profile interface is a hands-free profile Bluetooth interface.

22. An adaptive noise cancelling system comprising:
a plurality of multi-axis accelerometers;
a plurality of microphones, wherein the plurality of multi-axis accelerometers and the plurality microphones in combination pick up vibrations on a chassis of a vehicle for canceling background noise,
wherein the plurality of microphones is an array of microphones processed via a beamformer to generate a virtual microphone signal with road noise of the vehicle; and
a telephony noise canceller receiving the virtual microphone signal and signals from the plurality of multi-axis accelerometers, wherein the plurality of microphones also provide a speech signal of a user of the vehicle to the telephony noise canceller, and wherein the telephony noise canceller is configured to remove correlated road noise via linear subtraction,
wherein the telephony noise canceller is configured to:
use an adaptive algorithm, which derives one or more filter weights that model a transfer function between vibrations on a chassis of the vehicle measured by the plurality of multi-axis accelerometers and an acoustic pressure signal, wherein the acoustic pressure signal is the virtual microphone signal received from the beamformer;
predict the correlated road noise signal based on the one or more filter weights and the signals received from the plurality of multi-axis accelerometers; and
subtract the predicted correlated road noise signal from the acoustic pressure signal;
wherein the adaptive noise cancelling system further comprises an adaptive echo canceller and a noise suppressor,
the adaptive echo canceller is configured to receive an output signal of the telephony noise canceller and cancel an echo from the output signal of the telephony noise canceller, and the noise suppressor is configured to:
receive an output signal of the adaptive echo canceller and estimate, based on information from the plurality of multi-axis accelerometers, a spectrum of a residual noise of the output signal of the adaptive echo canceller; and
suppress the residual noise using spectral subtraction.

23. The adaptive noise cancelling system of claim 22, additionally comprising a hands-free profile interface that receives the output of the telephony noise canceller and is configured to equalize and range limit the received signal.

24. The adaptive noise cancelling system of claim 23, wherein the hands-free profile interface is a hands-free profile Bluetooth interface.

25. A method for cancelling noise in a vehicle, comprising:
reading accelerometer data from a plurality of multi-axis accelerometers mounted to the vehicle;
obtaining voice data from a plurality of microphones located in the cabin of the vehicle; and
inputting the accelerometer data and voice data a telephony noise canceller to remove correlated road noise via linear subtraction;
wherein the removing the correlated road noise via linear subtraction comprises:
using an adaptive algorithm, which derives one or more filter weights that model a transfer function between vibrations on a chassis of the vehicle measured by the plurality of multi-axis accelerometers and an acoustic pressure signal, wherein the acoustic pressure signal is a received microphone signal or a virtual microphone signal received from a beamformer;
predicting the correlated road noise signal based on the one or more filter weights and the accelerometer data; and
subtracting the predicted correlated road noise signal from the acoustic pressure signal;
wherein the adaptive algorithm is a normalized leaky least mean squares algorithm.

26. The adaptive noise cancelling system of claim 22, wherein the adaptive algorithm is a normalized leaky least mean squares algorithm.

27. The adaptive noise cancelling system of claim 22, wherein at least one accelerometer of the plurality of multi-axis accelerometers is positioned on a suspension knuckle of the vehicle or is positioned on a suspension joint of the vehicle.

28. The adaptive noise cancelling system of claim 22, wherein each of the plurality of multi-axis accelerometers output accelerometer data in three channels.

29. The adaptive noise cancelling system of claim 22, wherein the plurality of multi-axis accelerometers use a sample clock that is the same clock as used by the plurality of microphones.

30. The adaptive noise cancelling system of claim 22, wherein the plurality of multi-axis accelerometers use an automotive audio bus (A2B) that is the same audio bus as used by the plurality of microphones.

* * * * *